United States Patent [19]

Lynes et al.

[11] Patent Number: 5,150,278
[45] Date of Patent: Sep. 22, 1992

[54] FINNED HOUSING

[75] Inventors: Kenneth W. Lynes; Zdenek Nepovim, both of Lindsay, Canada

[73] Assignee: J. E. Thomas Specialties Limited, Ontario, Canada

[21] Appl. No.: 700,844

[22] Filed: Apr. 16, 1991

[51] Int. Cl.$^5$ .............................................. H05H 7/20
[52] U.S. Cl. ............................ 361/386; 165/80.3; 361/383
[58] Field of Search .................. 165/80.3, 104.33, 185; 174/16.3; 357/81, 82; 361/382–389, 379, 390, 392, 394–395, 399

[56] References Cited

U.S. PATENT DOCUMENTS

| | | | |
|---|---|---|---|
| 3,421,578 | 1/1969 | Marton | 165/80.3 |
| 4,237,521 | 12/1980 | Denker | 361/384 |
| 4,765,397 | 8/1988 | Chrysler et al. | 165/104.33 |

Primary Examiner—Gregory D. Thompson

[57] ABSTRACT

An electrical component housing has a wall with an outwardly facing wall shaped to define rows of cooling fins with row channels between. Gaps are provided in the fin rows to define angle channels at 30° to 60° to the row channels.

18 Claims, 4 Drawing Sheets

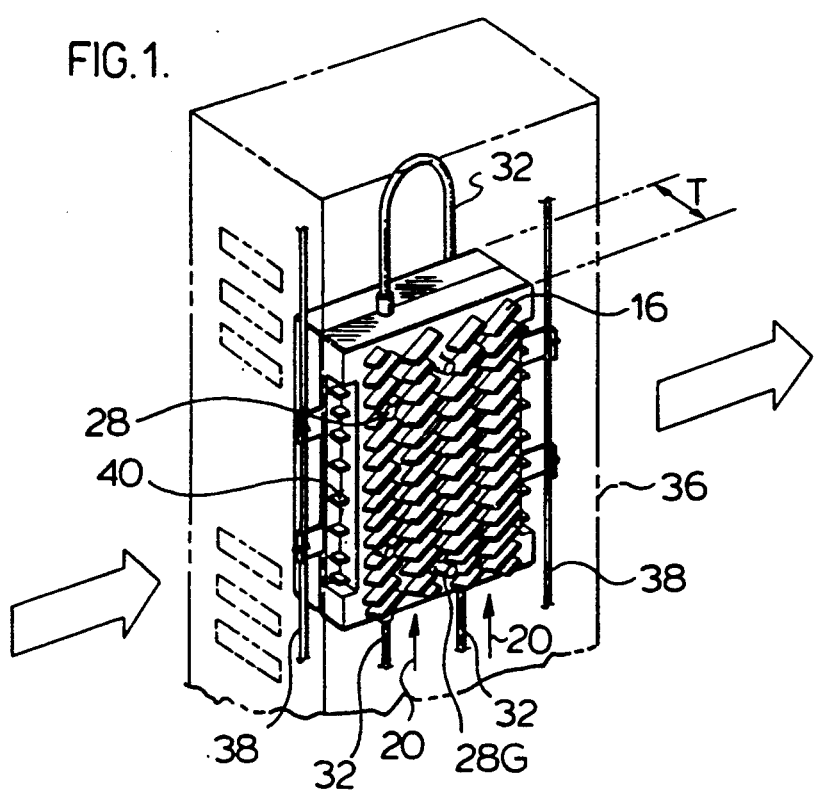
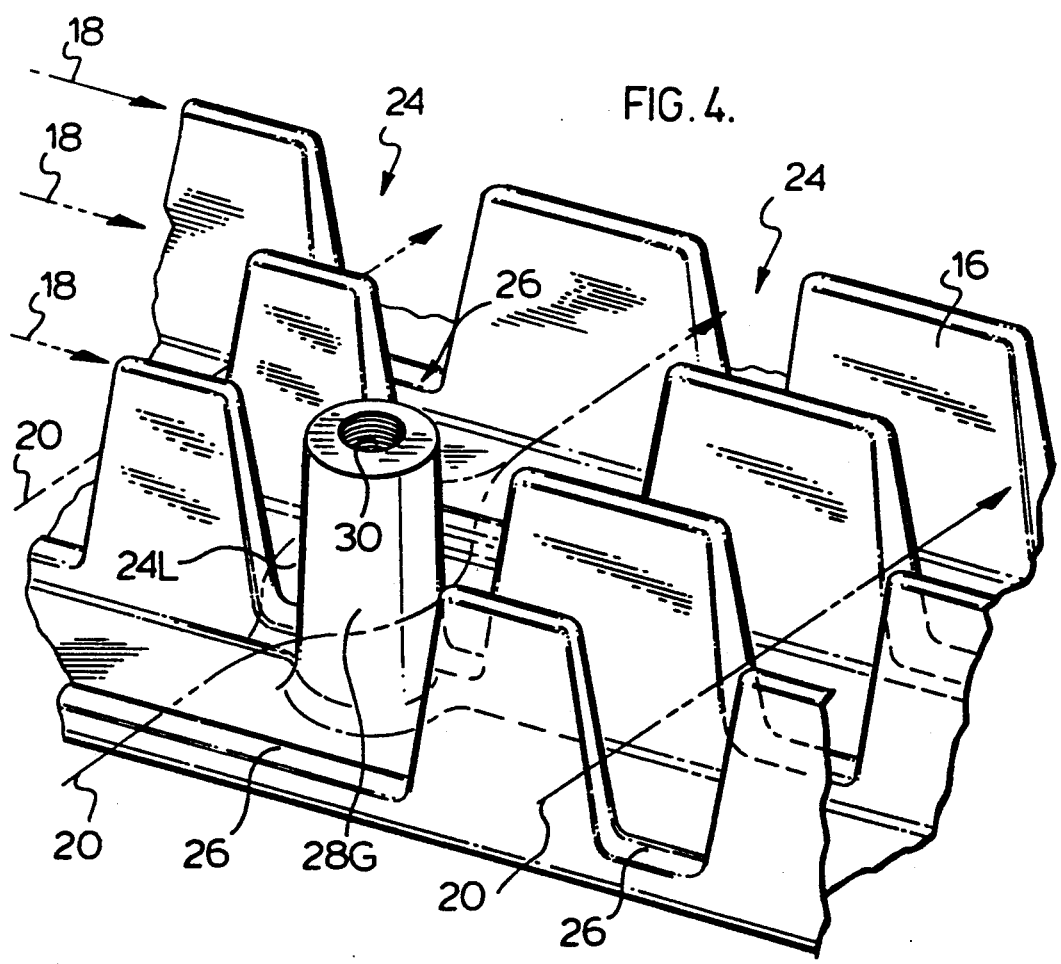

FINNED HOUSING

FIELD OF THE INVENTION

This invention relates to a metal housing for electrical equipment with cooling fins for dissipating the heat created by the housed electrical components. The housing is particularly designed for housing cable TV ('CATV') line equipment although its field of use is not necessarily limited thereto.

It is known to provide finned metal housings to dissipate heat caused by operation of housed equipment. However such fins in the past have not been designed to provide for smooth relatively rapid flow of air thereover to carry away the heat. (In various aspects of the prior art and with the invention, it is noted that the air flow over such fins will arise from convection, the wind in outdoor installations, induced by a fan, or in other ways).

SUMMARY OF THE INVENTION

This invention provides a casing with a fin array thereon designed to provide for smooth flow of the air over the fins and for good extraction of the casing heat from the fins by the air whether moved by convection, wind or fan. The usual type of housing with which the insertion is concerned will have a bottom member being a bottom wall to which the amplifiers and most active (heat generating) components are attached with partial side walls which combines with a top member having a top wall with partial side walls, the two members fitting or closing together to form a completed housing. The terms 'bottom' and 'top' wall are used herein even though the housing may, in use assume a number of orientations. A common orientation has both bottom and top walls in vertical planes as shown in some of the figures herein.

In accord with a broad aspect of the invention the invention is constituted by a fin array applied to a relatively flat bottom wall housing surface. The fin array comprises fins arranged in rows which rows are spaced from each other along their lengths. The rows are spaced to define row channels for air flow there between. The fins in a row are spaced by gaps to define approximately aligned angle channels across a plurality of rows at 30°-60° to the row channels. The row channels are open at the end to allow easy ingress and egress of air having flow directions generally parallel to the outside surface. The angle channels are preferably open at the end for the same reason.

For best results (ignoring some practical and aesthetic considerations) the fin channels would be arranged parallel to the expected air flow; e.g.: vertical for convection, horizontal for wind, and, as designed, for fans. However practical and aesthetic considerations will sometimes cause the fins to be oriented at up to 60° to the expected air flow as hereinafter described.

If a fin row comprised a single fin for the length of the row the fins would have to be spaced wide enough apart to avoid undue frictional effect on air flow from the fin sides. Further the air travelling along a row channel will absorb heat as it passes along the row. Thus the single fin rows would have to be sufficiently spaced to provide sufficient air to maintain its cooling effect until exit from the downstream end of the channel. Therefore angle channels, as above described, are provided by the provision of gaps in the fin rows so that the row channel air at each angle channel may move between channel rows. It is found that the rows may then be placed closer together than with a single fin per row and that the cooling gain from having a larger number of rows exceeds the loss due to the gaps in the fins. For reasons associated with practical and aesthetic aspects to be described hereafter the angle channels are arranged at 30° to 60° to the row channels.

In a preferred aspect of the invention so far described the gaps in the fins do not extend inward to the housing surface but are inwardly bounded by metal ridges which join the fins on each side of the gap. It is found that the heat conduction along the ridges carries heat between fins and increases the heat exchange between the fins in a row, considered collectively, and the flowing air. The heat equalizing effect of the ridges is particularly important since electrical components in the housing will heat some fins in a row more than others.

In a preferred aspect of the invention the angle channels are at about 45° to the row channels for reasons discussed hereafter.

The most common application of the invention is for housing CATV line components. Such CATV equipment housings are customarily of rectangular form and for both practical and aesthetic reasons should be mounted with the long dimension vertical or horizontal. To provide for flow in the row channels in either orientation, the best compromise is believed to be to have the row channels at 45° to the longitudinal direction. They will then be at 45° degrees to vertical or horizontal air flow whether mounted with the long dimension horizontal or vertical.

The gaps in the fins are arranged so that the angle channel extends in the long dimension. This is because the capacity of the air to cool is used most fully for flow in the long dimension of the housing so the flow in this direction is facilitated.

In some cases it is desireable to guide the air along the finned housing to reduce the turbulence associated with air moving outwardly out of the row or angle channel and being replaced by other (inflowing) air. Accordingly, in a preferred embodiment of the invention, a generally planar shroud is placed parallel to the finned surface and in contact with or narrowly space from the outer fin edges.

DESCRIPTION OF THE DRAWINGS

In drawings which illustrate a preferred embodiment of the invention:

FIG. 1 is a view of an enclosed finned housing in accord with the invention with the long dimension of the housing vertical, FIG. 4 is an enlarged view of the fins in the fin array.

DETAILED DESCRIPTION

Figure 2:
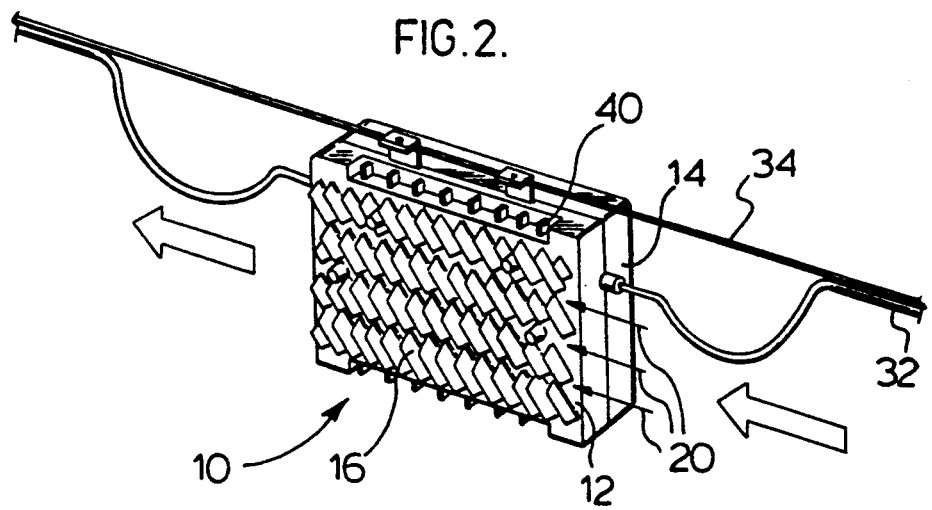
FIG. 2 is a view of an exposed finned housing with the long dimension of the housing horizontal.

In the drawings a metal housing 10 has a bottom member with a bottom wall 12 and a top member 14 with a top wall not shown. The housing is for CATV line equipment and customarily most of the heat generating components, e.g. amplifiers and the like, located inside the housing, will be attached to the bottom wall 12 which will be provided with the finned array in accord with the invention. The wall is metal and customarily designed for temperatures between −40° and 50° C. in the open air, as in FIG. 2, and between −40° C. and 62° C. in an enclosed area, as in FIG. 1. The top wall may be without fins on the assumption that the heat dissipation problem will not require a finned surface. However it is within the scope of the invention to provide that the top wall (not shown) also has on its outer surface a finned array of the same planar disposition as that to be described for the bottom wall but possibly with smaller fin height if the cooling demands are less.

Figure 3:
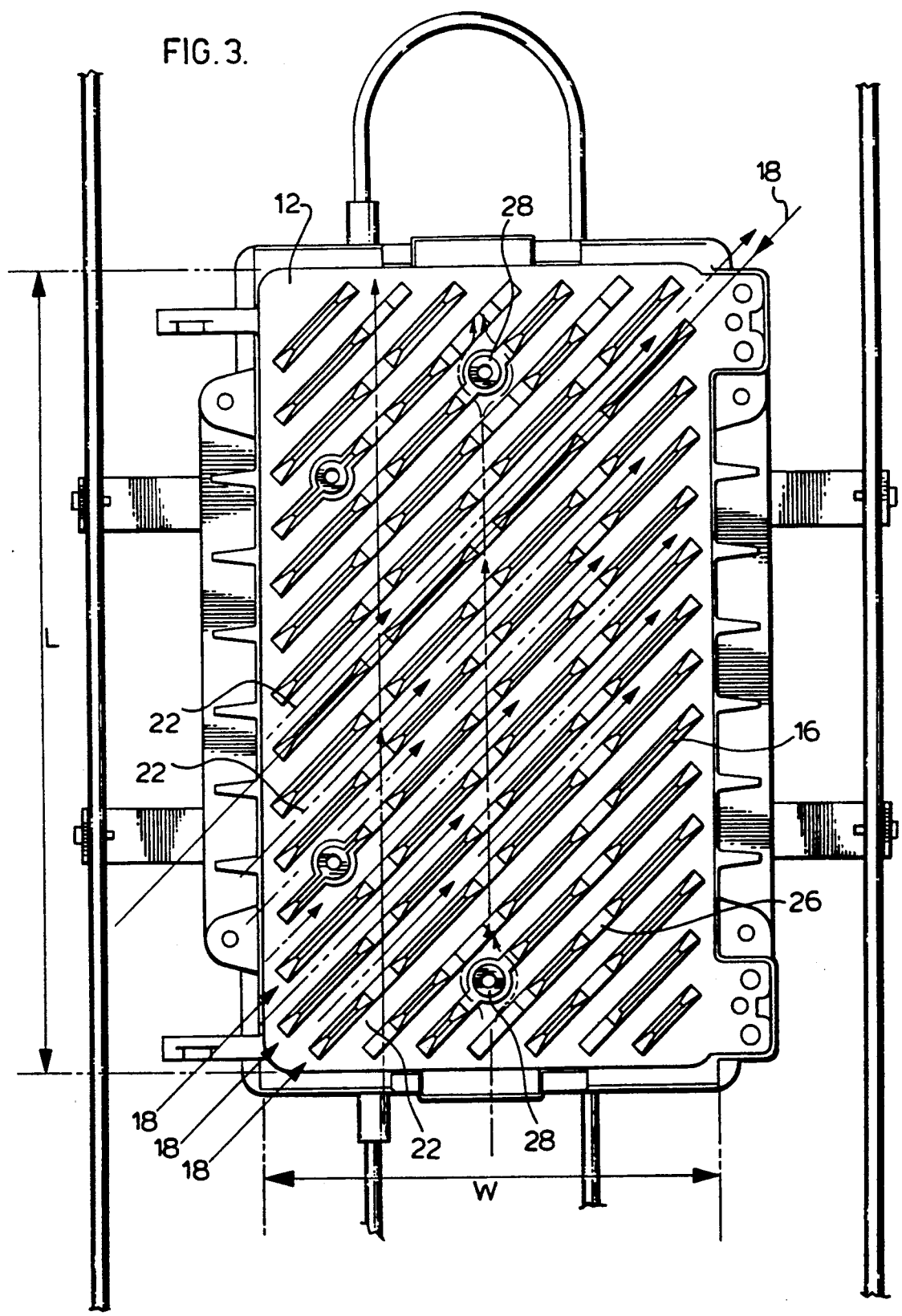
FIG. 3 is a front view of the fin array in vertical orientation.

In FIG. 3 is shown the outer surface of bottom wall 12 which has a generally planar form and which, has an array with a length dimension L and a width dimension W and a thickness dimension T, the latter indicated in FIG. 1.

Projecting outwardly from the surface are the fins 16 of fin rows 18. The fin rows run at 30°–60° and preferably at 45° to the longitudinal dimension L of the housing and define between them row channels 22 running in the same direction.

Gaps 24 between fins 16 are spaced, having regard to the row spacing, to be substantially aligned in the length direction L to define corresponding angle channels 20.

Preferably the inside of each gap 24 is defined by a ridge 26 projecting outwardly from the surface of wall 12 a short distance relative to the height of fins 16 and contiguously joining the fins 16 on each side of the gap. As previously noted, the ridges 26, by their thermal conductivity distribute heat between a hotter fin and a cooler one and thus increase the rate of heat dissipation of the fins in a row, collectively.

Four mounting posts 28 with threaded mounting wells 30 therein are provided for mounting the housing on a support or other equipment on the housing. More or less mounting posts may be used as desired. The indicated location of the posts is exemplary only and not definitive and post 28G is shown occurring in a gap 24L with the gap consequently longer than the usual gap 24 to provide the requisite angle channel width for air flow about the post.

In general, the details of the housing contents, top and bottom member connection, housing mounting means, housing closure, connection posts cable connectors etc. are not shown as they form no part of the invention. The outer and inner walls each with an attached portion of the side walls are each preferably cast as a unit including the fin structure defined.

FIG. 2 shows a finned housing 10 in accord with the invention mounted on a strand wire 34 in horizontal orientation, with cables 32 connected to the ends of the housing. The housing in horizontal orientation provides that the angle channels 20 extend horizontally allowing flow between fin channels in the horizontal direction which corresponds to the usual wind direction. It will be noted that the housing should be horizontal for both practical and aesthetic reasons, the latter because an oddly angled housing would appear unsightly, the former because it facilitates mounting on the stand wire 34 and the end connections of the CATV cable 32. Temperatures of −40° C. to 50° C. will be encountered and the cooling of the fin array must work at temperatures at and near the upper end of the range.

In FIG. 1 is shown a pillar shaped enclosure 36 with the housing mounted with its longitudinal dimension vertical. This is the proper orientation since it best fits the housing to the narrow space available and facilitates connection of cables 32 to the end ports of the housing. The finned surface thus provides that the angle channels 20 run vertically to facilitate vertical convection flow between the fin channels. Such enclosed arrangement must handle temperatures of between −40° C. and 62° C. and must adequately cool the housing at the upper end of the range.

The mounting for enclosure 36 is not shown as well known to those skilled in the art. The housing 10 is shown as mounted on rods 38, also as well known in the art. Mounting means other than rods 38 may be used if desired within the scope of the invention. Not shown also as well known are the upper and lower connection and support for the rods 38. Cable 32 is shown as connected to upper and lower ports (not shown) in housing 10.

The description and drawings describe a finned surface on the outer wall of a housing which usually corresponds to the 'bottom' to which, on the inside of which the major heat generating electrical components are customarily mounted. If equal heat dissipation is required on the outside of the top wall (not shown) then the outer surface of the top wall may be provided with a fin array similar to that shown. If some cooling is required on the top wall but the need is less than the bottom, then the outside of the top wall may be provided with a fin array in accord with the invention but with fins of lesser depth. Further, if no cooling is required then the top wall may be without fins.

The housing is customarily provided with side fins 40 which do not form part of the invention.

Although the CATV housing is customarily generally rectangular with length and width larger than the thickness, the inventive fin arrangement may be applied to a metal housing wall of other shape with the angle channel at 30°–60° (although preferably 45°) to the row channel. Although the inventive finned arrangement might be applied to any wall of a housing, it will usually be impractical or unproductive to provide such arrangement on the walls where the closure takes place or where the hinges are located. On such walls the closure or hinge hardware would interfere substantially with air flow through fin channels. The finned housing will, for best results, be mounted with the angle channel directed toward the expected cooling flow.

With the preferred embodiment the metal fins are cast as a contiguous part of the metal housing wall. This would also be suitable with many other forms of the invention. It will be realized that the metal housing wall assists in the dissipation of heat by the fin array of the invention, since it carries heat from hotter to cooler locations in the housing wall from which the heat is dissipated by the adjacent fins as well as by the wall itself. The housing members will preferably be made of cast aluminum.

For adequate and smooth flow of air into and out of row channels 22 and angle channels 20 the housing is designed so that each end of such channel is open i.e. without impediment for easy ingress of air to and egress of air from the channels.

In the embodiments of FIGS. 1-4 air flowing in a row or angle channel is of course free to move transversely out of the channel, that is, to move with a component perpendicular to the housing surface. Such movement of air transversely out of the channel must be complemented by the movement of other air into the channel and this will frequently also have a transverse component. There is thus potential for some degree of turbulence in the flow relative to the channel although for best cooling effect the flow must be as smooth as possible.

Figure 5:
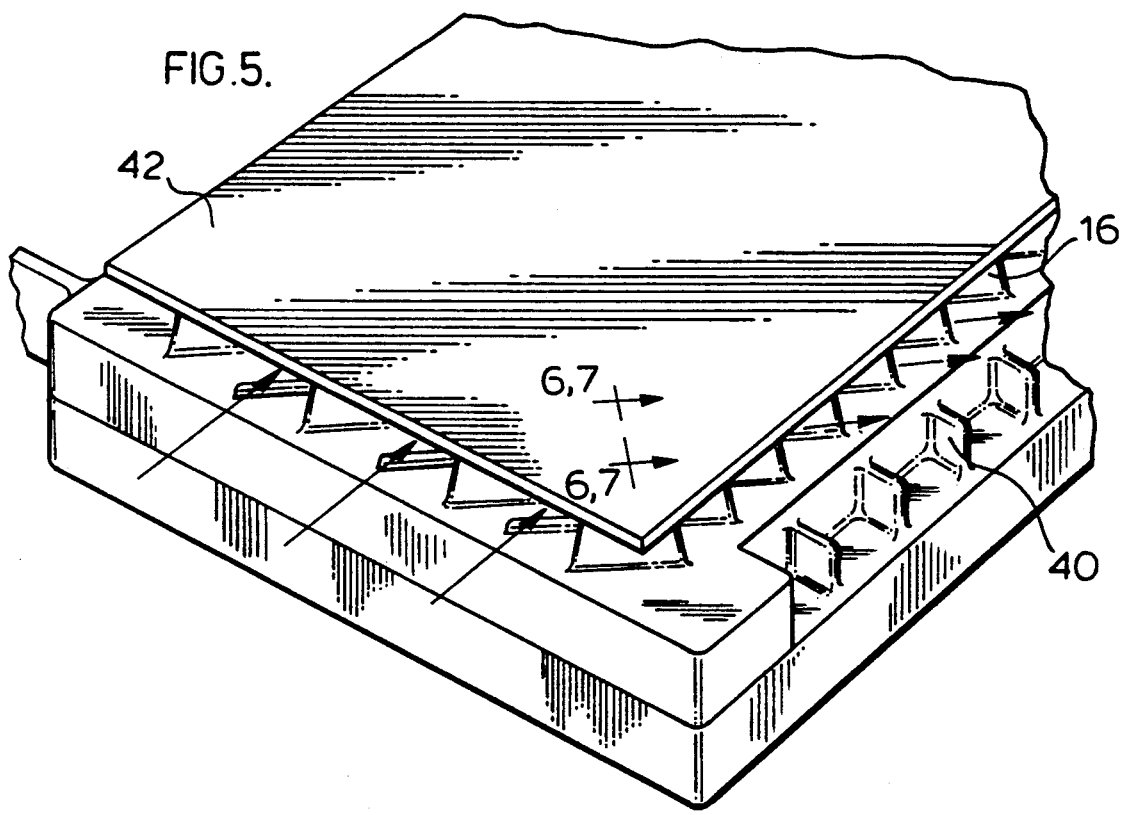
FIG. 5 shows the use of a shroud with the invention.
Figure 6:
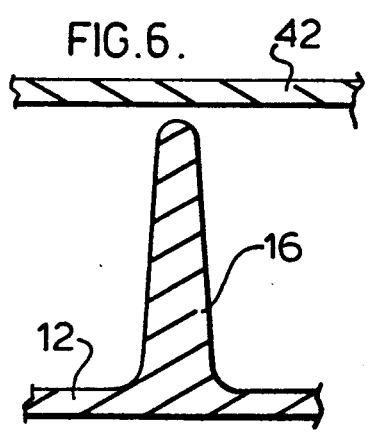
FIGS. 6 and 7 show alternate sections of the relationship of the shroud with the fins, along the lines 6—6, and 7—7 respectively of FIG. 5
Figure 7:
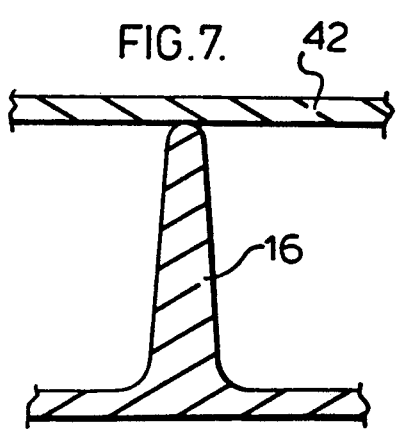

In some applications therefore it will be useful to combine the finned array, in accord with the invention with a planar shroud 42 as shown in FIGS. 5-7. The shroud 42 is arranged to be, at least approximately, parallel to the bottom wall and the median plane of the finned array, and supported in that orientation and the desired spacings by means not shown. FIG. 6 is a section showing the shroud narrowly spaced from the tops of the fins to maintain the flow of air in or near the fin array. FIG. 7 is a section showing the shroud in contact with the fin edges of the fin array to confine the air flow in the row or angle passages. With the arrangement of FIGS. 6 or 7 the shroud may preferably be of metal to help achieve a heat equalizing effect across the array. However, good results have also been obtained when the shroud was non conducting.

The dimensions of the various fin array parameters will be designed, in any particular situation, to meet the cooling requirements for a particular usage and environment.

There follows the best mode now known to us, a preferred set of dimensions for the CATV uses illustrated in FIGS. 1 and 2. However, it will be realized that the dimensions below are not intended to be limiting and that the scope of the invention is to be read from the appended claims.

Figure 9:
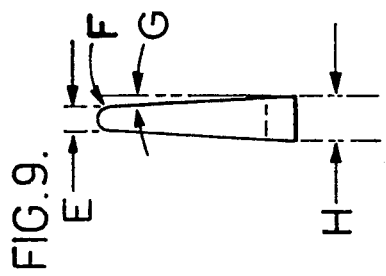
FIG. 9 is a line along the lines 9—9 of FIG. 8.
Figure 8:
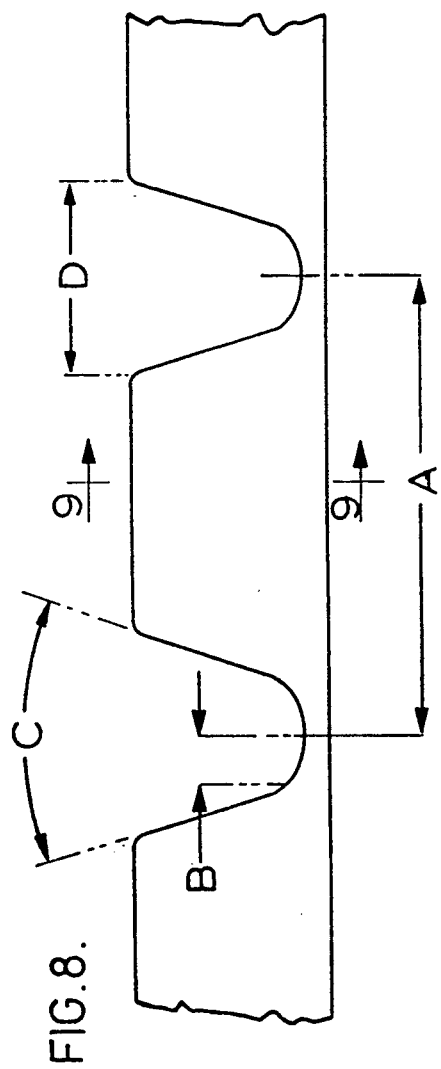
FIG. 8 shows some fin dimensions as from the aspect viewed along a line perpendicular to a fin row.
Figure 10:
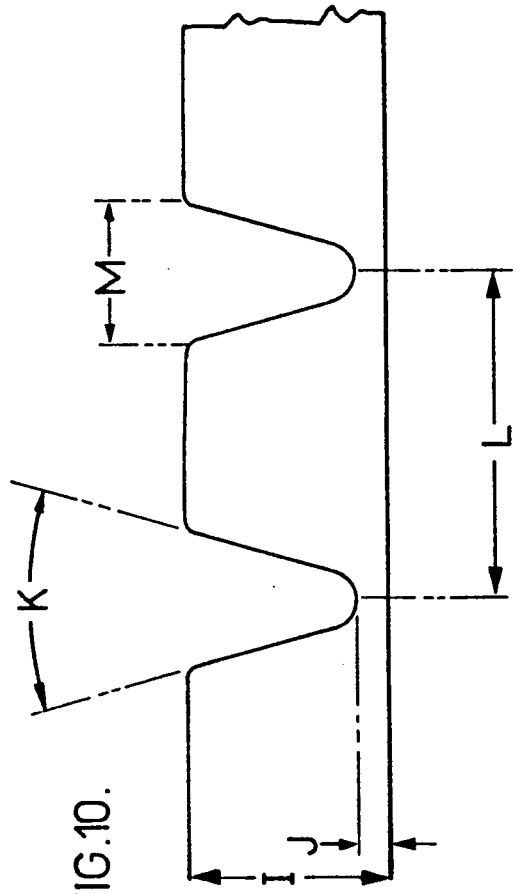
FIG. 10 shows some fin dimensions from the aspect viewed along the long dimension of the housing e.g. along a line 20 as indicated in FIG. 1.

For the CATV applications of FIGS. 1 and 2, I prefer to use a housing which contains CATV amplifying components having top and bottom members made of cast aluminum. The bottom member has on its outer surface a fin array with the following parameters:

FIGS. 8, 9 and 10 show exemplary parameters for a presently preferred design using the invention. FIG. 8 shows the fin dimensions viewed perpendicular to the fin row. FIG. 10 shows the view along one of angle rows 20, parallel to the long dimension of the housing. Thus FIG. 10 represents an angle channel as presented to the intended main air flow. As shown in FIGS. 8-10 preferred parameters for a preferred design are:

As FIG. 8 shows that preferred dimensions are:

| A | centre-to-centre gap spacing | 2.013" |
| B | ½ width of gap root | .220" |
| C | convergence angle of gap sides | 36.344° |
| D | outer gap width | .890" |

As FIG. 9 shows that preferred dimensions are:

| E | width of fin tip | .090" |
| F | radius of fin tip | .047" |
| G | slope of fin side to perpendicular | 3.000° |
| H | fin root width | .184" |

FIG. 10 shows that preferred dimensions are:

| I | fin height | .900" |
| J | ridge height | .125" |
| K | convergence angle of gap sides (as seen in longitudinal direction) | 30.000° |
| L | center-to-center gap spacing (as seen in longitudinal direction) | 1.423" |
| M | outer gap width (as seen in longitudinal direction) | .603" |

Not shown in FIGS. 8-10 is the thickness of the bottom wall 12 on which the fins are mounted or the center to center fin spacing. The preferred device with dimensions as shown above would have a bottom wall thickness of 0.120" and a fin row spacing (center to center) of 0.500".

The parameters given above are exemplary of a presently preferred arrangement and although given with precision should not be taken as limiting the invention which is limited only by the appended claims.

The number of row channels or angle channels shown and described are exemplary only and can vary in accord with specific design within the scope of the invention as defined by the appended claims.

I claim:

1. A housing for electrical components having a generally planar metal wall defining a longitudinal dimension greater than a width dimension comprising:
   metal fins projecting outwardly from the outside surface of said wall,
   said fins being arranged in rows with said rows spaced from each other along their lengths to define row channels,
   said fins in respective rows being spaced by gaps,
   the arrangement of said gaps in the respective row providing approximately aligned angle channels across a plurality of rows at an angle of 30°-60° to said row channels,
   said fins and gaps being arranged to provide that said angle channels are generally parallel to said longitudinal dimension;
   said row channels and angle channels being open at the end to allow easy ingress and egress of air having flow directions generally parallel to said outside surface.

2. Metal housing as claimed in claim 1 wherein said row channels and said angle channels are at an angle of about 45° to each other.

3. Metal housing as claimed in claim 2, having a generally planar shroud parallel to said outer surface and not more than a short distance outside of the outer edges of said fins.

4. Metal housing as claimed in claim 2 wherein said housing is of generally rectangular shape.

5. Metal housing as claimed in claim 4, having a generally planar shroud parallel to said outer surface and not more than a short distance outside of the outer edges of said fins.

6. Metal housing as claimed in claim 1 wherein said housing is of generally rectangular shape.

7. Metal housing as claimed in claim 6, having a generally planar shroud parallel to said outer surface and not more than a short distance outside of the outer edges of said fins.

8. Metal housing as claimed in claim 1, having a generally planar shroud parallel to said outer surface and not more than a short distance outside of the outer edges of said fins.

9. A housing for electrical components having a generally planar metal wall,
   metal fins projecting outwardly from the outside surface of said wall,
   said fins being arranged in rows with said rows spaced from each other along their lengths to define row channels,
   said fins in respective rows being spaced by gaps,
   the arrangement of said gaps in the respective rows providing approximately aligned angle channels across a plurality of rows at an angle of 30°-60° to said row channels,
   said row channels and angle channels being open at the end to allow easy ingress and egress of air having flow directions generally parallel to said outside surface,
   wherein metal ridges are located on said outside surface extending contiguously between adjacent fins, the outer edge of each said ridge projecting from said surface a small distance relative to the projection of the fins.

10. Metal housing as claimed in claim 9, having a generally planar shroud parallel to said outer surface and not more than a short distance outside of the outer edges of said fins.

11. Metal housing as claimed in claim 9, wherein said row channels and said angle channels are at an angle of about 45° to each other.

12. Metal housing as claimed in claim 11, having a generally planar shroud parallel to said outer surface and not more than a short distance outside of the outer edges of said fins.

13. Metal housing as claimed in claim 11 wherein said wall defines a longitudinal dimension greater than a width dimension and said angle channels are arranged generally parallel to said length dimension.

14. Metal housing as claimed in claim 13 wherein said housing is of generally rectangular shape.

15. Metal housing as claimed in claim 14, having a generally planar shroud parallel to said outer surface and not more than a short distance outside of the outer edges of said fins.

16. Metal housing as claimed in claim 9 wherein said wall defines a longitudinal dimension greater than a width dimension and said angle channels are arranged generally parallel to said length dimension.

17. Metal housing as claimed in claim 6 wherein said housing is of generally rectangular shape.

18. Metal housing as claimed in claim 17, having a generally planar shroud parallel to said outer surface and not more than a short distance outside of the outer edges of said fins.

* * * * *